United States Patent
Wan et al.

(10) Patent No.: US 9,608,075 B1
(45) Date of Patent: Mar. 28, 2017

(54) III-NITRIDE SEMICONDUCTOR DEVICE WITH DOPED EPI STRUCTURES

(71) Applicant: Infineon Technologies Americas Corp., El Segundo, CA (US)

(72) Inventors: Jianwei Wan, Woodbury, MN (US); Mihir Tungare, Roseville, MN (US); Peter Kim, Stillwater, MN (US); Seong-Eun Park, Woodbury, MN (US); Scott Nelson, River Falls, WI (US); Srinivasan Kannan, Maplewood, MN (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/173,263

(22) Filed: Jun. 3, 2016

(51) Int. Cl.
| H01L 29/66 | (2006.01) |
| H01L 29/205 | (2006.01) |
| H01L 29/20 | (2006.01) |
| H01L 29/207 | (2006.01) |
| H01L 21/02 | (2006.01) |
| H01L 29/778 | (2006.01) |

(52) U.S. Cl.
CPC ........ H01L 29/205 (2013.01); H01L 21/0254 (2013.01); H01L 21/02381 (2013.01); H01L 21/02458 (2013.01); H01L 21/02502 (2013.01); H01L 29/2003 (2013.01); H01L 29/207 (2013.01); H01L 29/66462 (2013.01); H01L 29/7787 (2013.01)

(58) Field of Classification Search
CPC . H01L 29/205; H01L 29/2003; H01L 29/207; H01L 21/02381; H01L 21/02458; H01L 21/02502

USPC .................................... 257/12, 85, 183, 194
See application file for complete search history.

(56) References Cited

U.S. PATENT DOCUMENTS

| 6,617,060 B2 | 9/2003 | Weeks, Jr. et al. |
| 8,575,660 B2 | 11/2013 | Nelson et al. |

OTHER PUBLICATIONS

Persson, Eric, "How 600 V GaN Transistors Improve Power Supply Efficiency and Density", Power Electronics Europe, Issue 2, Mar. 2015, pp. 22-24.

(Continued)

Primary Examiner — Tan N Tran
(74) Attorney, Agent, or Firm — Murphy, Bilak & Homiller, PLLC

(57) ABSTRACT

A compound semiconductor device includes a first III-nitride buffer layer doped with carbon and/or iron, a second III-nitride buffer layer above the first III-nitride buffer layer and doped with carbon and/or iron, a first III-nitride device layer above the second III-nitride buffer layer, and a second III-nitride device layer above the first III-nitride device layer and having a different band gap than the first III-nitride device layer. A two-dimensional charge carrier gas arises along an interface between the first and second III-nitride device layers. The first III-nitride buffer layer has an average doping concentration of carbon and/or iron which is greater than that of the second III-nitride buffer layer. The second III-nitride buffer layer has an average doping concentration of carbon and/or iron which is comparable to or greater than that of the first III-nitride device layer. A method of manufacturing the compound semiconductor device is described.

20 Claims, 4 Drawing Sheets

(56) References Cited

OTHER PUBLICATIONS

Zhang, Naiqian. "High voltage GaN HEMTs with low-on-resistance for switching Applications", Ph.D. dissertation, University of California, Santa Barbara, Sep. 2002.
Lidow, Alex et al., "Gallium Nitride (GaN) Technology Overview", GaN Transistors for Efficient Power Conversion, 1st Edition, Oct. 2012, pp. 1-4.
Tanaka, Kenichiro et al., "Suppression of current collapse by hole injection from drain in a normally-off GaN-based hybrid-drain-embedded gate injection transistor", Applied Physics Letters, AIP Publishing, 107, 163502 (2015), http://dx.doi.org/10.1063/1.4934184, pp. 1-4.

III-NITRIDE SEMICONDUCTOR DEVICE WITH DOPED EPI STRUCTURES

TECHNICAL FIELD

The present application relates to III-nitride semiconductors, in particular to III-nitride semiconductor devices with fast dynamic switching and high breakdown voltage characteristics.

BACKGROUND

GaN based HEMT (High Electron Mobility Transistor) devices are well suited as power switching devices. At the core of GaN HEMT power devices is an AlGaN/GaN heterojunction (also called barrier/channel) that confines high mobility 2DEG (two-dimensional electron gas) along its interface. HEMT devices are formed by source and drain contacts and the current is modulated by a gate voltage. To meet high breakdown voltage and low conduction loss requirements for GaN HEMT power devices, GaN epi structures must be carefully designed to provide sufficient vertical voltage blocking capability and high lateral electron mobility.

To realize GaN power devices which are cost competitive to their Si device counterparts, GaN is typically grown on 150 mm or 200 mm diameter Si substrates (GaN-on-Si) using MOCVD (Metal-Organic Chemical Vapour Deposition) reactors. Due to large differences in lattice constant and thermal expansion coefficient between Si and GaN, SiN and AlN based nucleation layers are typically grown on silicon substrates followed by multiple AlGaN transition layers with varied Al compositions to mitigate the lattice mismatch and thermal mismatch. A single GaN or AlGaN buffer layer doped with iron or carbon is deposited on the AlGaN transition layers for voltage blocking. A GaN channel layer and an AlGaN barrier layer are then grown on the single buffer layer doped with iron or carbon, so as to form the active HEMT device region where a high mobility (>1500 cm2/V·s) 2DEG can flow laterally along the AlGaN/GaN heterojunction interface.

GaN and AlGaN buffer layers become highly resistive when heavily doped with iron or carbon impurities, enabling high voltage blocking capability up to 1200V or even higher depending on doping level and buffer layer thickness. However, dopants intentionally incorporated into a buffer layer during the epi growth process to achieve high resistivity act as traps for free carriers from the 2DEG and lead to dynamic switching issues in power switching devices because of their deep level acceptor characteristics. For example, excessive high carbon concentration in a GaN epi-layer causes a dynamic switching issue known as current collapse or Rdson shift. The carbon impurities act as deep level traps which capture free carriers under high voltage stress (off-state) and lead to reduced current or higher Rdson (on-state resistance) afterwards in the on-state. This problem causes many reliability concerns with GaN HEMT-based power devices, and limits the commercialization of GaN-based power device switching technology.

Accordingly, there is a need for III-nitride semiconductor devices with both fast dynamic switching and high breakdown voltage characteristics.

SUMMARY

According to an embodiment of a compound semiconductor device, the compound semiconductor device comprises a first III-nitride buffer layer doped with carbon and/or iron, a second III-nitride buffer layer above the first III-nitride buffer layer and doped with carbon and/or iron, a first III-nitride device layer above the second III-nitride buffer layer, and a second III-nitride device layer above the first III-nitride device layer and having a different band gap than the first III-nitride device layer. A two-dimensional charge carrier gas arises along an interface between the first and second III-nitride device layers. The first III-nitride buffer layer has an average doping concentration of carbon and/or iron which is greater than that of the second III-nitride buffer layer. The second III-nitride buffer layer has an average doping concentration of carbon and/or iron which is comparable to or greater than that of the first III-nitride device layer.

According to an embodiment of a method of manufacturing a compound semiconductor device, the method comprises: forming a first III-nitride buffer layer having a first average doping concentration of carbon and/or iron; forming a second III-nitride buffer layer above the first III-nitride buffer layer, the second III-nitride buffer layer having a second average doping concentration of carbon and/or iron which is less than the first average doping concentration; forming a first III-nitride device layer above the second III-nitride buffer layer, the first III-nitride device layer having a third average doping concentration of carbon and/or iron which is comparable to or less than the second average doping concentration; and forming a second III-nitride device layer above the first III-nitride device layer, the second III-nitride device layer having a different band gap than the first III-nitride device layer, wherein a two-dimensional charge carrier gas arises along an interface between the first and second III-nitride device layers.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a compound semiconductor device with fast dynamic switching and high breakdown voltage characteristics. The compound semiconductor device includes adjacent III-nitride device layers which have different band gaps, and a two-dimensional charge carrier gas arises along the interface between the III-nitride device layers. Two or more III-nitride buffer layers disposed below the device layers are doped with carbon and/or iron. A lower one of the III-nitride buffer layers has an average doping concentration of carbon and/or iron which is greater than that of the layers above it. An upper one of the III-nitride buffer layers also is doped with carbon and/or iron, and has an average doping concentration of carbon and/or iron which is comparable to or greater than that of the III-nitride device layers above it.

The (lower) III-nitride buffer layer with the higher average doping concentration of carbon and/or iron yields high breakdown voltage. The (upper) III-nitride buffer layer with the lower average doping concentration of carbon and/or iron yields fast dynamic switching, since this layer is interposed between the device layers and the lower III-nitride buffer layer with the higher average doping concentration of carbon and/or iron. One or more additional III-nitride buffer layers can be interposed between the lower and upper III-nitride buffer layers. Each additional III-nitride buffer layer has an average doping concentration of carbon and/or iron which is between that of the lower and upper III-nitride buffer layers.

Figure 1:
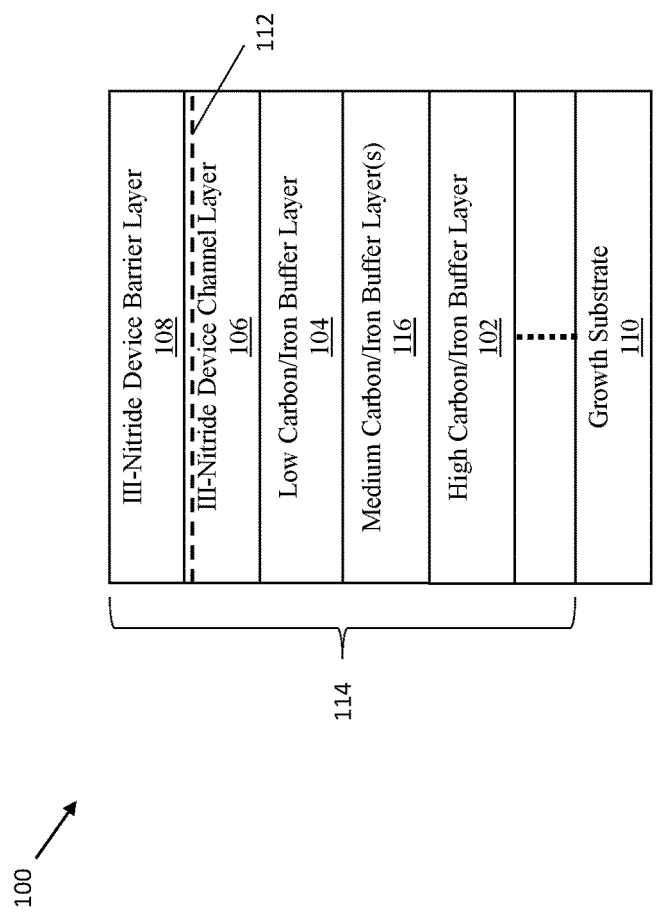
FIG. 1 illustrates a sectional view of an embodiment of a compound semiconductor device having doped epi structures.

FIG. 1 illustrates an embodiment of a compound semiconductor device 100. The compound semiconductor device 100 includes a first (lower) III-nitride buffer layer 102, a second (upper) III-nitride buffer layer 104 above the lower III-nitride buffer layer 102, a first (channel) III-nitride device layer 106 above the upper III-nitride buffer layer 104, and a second (barrier) III-nitride device layer 108 above the channel layer 106. The upper and lower III-nitride buffer layers 102, 104 are interposed between a growth substrate 110 and the III-nitride device layers 106, 108. The device barrier layer 108 has a different band gap than the device channel layer 106, and a two-dimensional charge carrier gas 112 arises along the interface between the device channel and barrier layers 106, 108. The two-dimensional charge carrier gas 112 can be a 2DEG (two electron-dimensional electron gas) or a 2DHG (two-dimensional hole gas) depending on the type of compound semiconductor device, and forms the channel region of the device 100. In the case of a HEMT device, the channel current in the two-dimensional charge carrier gas 112 between source and drain contacts is modulated by a gate voltage. The source and drain contacts can be formed at the same or opposite sides of the heterostructure stack 114, and are not shown in FIG. 1 for ease of illustration.

The lower and upper III-nitride buffer layers 102, 104 are doped with carbon and/or iron. The lower III-nitride buffer layer 102 has an average doping concentration of carbon and/or iron which is greater than that of the upper III-nitride buffer layer 104. The upper III-nitride buffer layer 104 has an average doping concentration of carbon and/or iron which is comparable to or greater than that of the III-nitride device channel layer 106. Accordingly, the lower III-nitride buffer layer 102 yields high breakdown voltage and the upper III-nitride buffer layer 104 yields fast dynamic switching since the lower-doped buffer layer 104 is interposed between the higher-doped buffer layer 102 and the overlying III-nitride device layers 106, 108. In one embodiment, the concentration of carbon and/or iron in the lower III-nitride buffer layer 102 yields a breakdown voltage greater than 700V and the concentration of carbon and/or iron in the upper III-nitride buffer layer 104 yields a shift in Rdson from an off-state to an on-state of less than 20%. The constituent doping element in the lower and upper III-nitride buffer layers 102, 104 can be just carbon, just iron or a combination of carbon and iron.

As shown in FIG. 1, one or more additional III-nitride buffer layers 116 can be interposed between the lower III-nitride buffer layer 102 and the upper III-nitride buffer layer 104. Each additional III-nitride buffer layer 116 has an average doping concentration of carbon and/or iron which is between that of the lower and upper III-nitride buffer layers 102, 104.

By providing at least two III-buffer layers 102, 104 with different average doping concentrations of carbon and/or iron between the growth substrate 110 and the III-nitride device layers 106, 108, both high voltage blocking and fast dynamic switching is provided for HEMT power devices.

Figure 2:
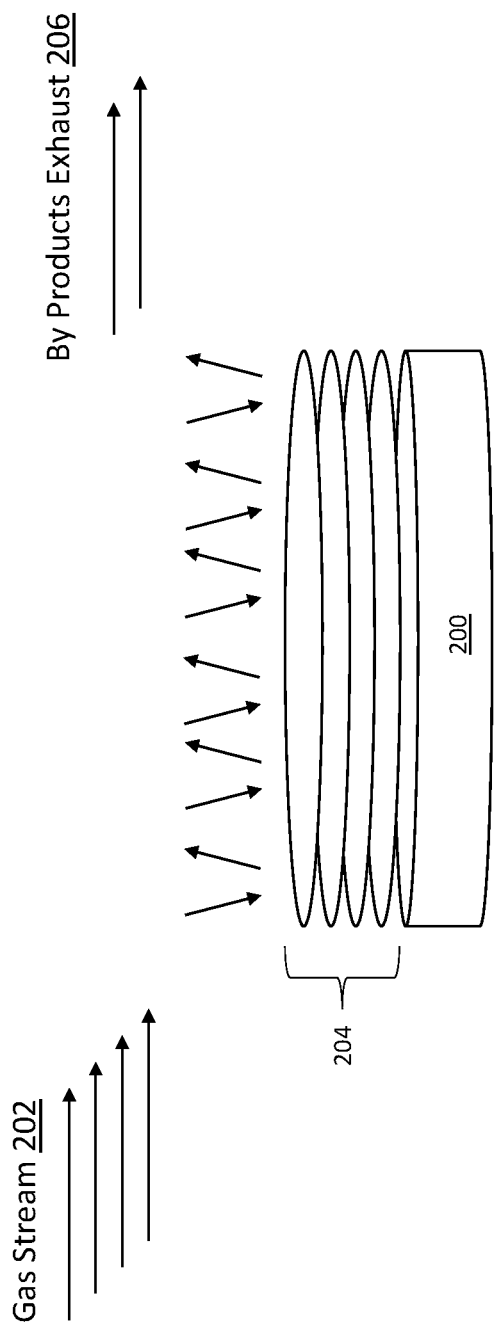
FIG. 2 illustrates a perspective view of an embodiment of an MOCVD process for manufacturing the compound semiconductor device shown in FIG. 1.

FIG. 2 illustrates an embodiment of an MOCVD (Metal-Organic Chemical Vapour Deposition) eptixay process for forming the different III-nitride layers of the compound semiconductor device 100 shown in FIG. 1. MOCVD is a technique for depositing thin layers of atoms onto a semiconductor wafer. The growth of crystals is by chemical reaction and not physical deposition, and the thickness of each layer can be precisely controlled as can constituent doping concentration. In MOCVD, gases are injected into a reactor and finely dosed to deposit a very thin layer of atoms onto a semiconductor wafer 200. The injected gas stream is labeled 'Gas Stream' 202 in FIG. 2. Surface reaction of organic compounds or metalorganics and hydrides containing the required chemical elements creates conditions for crystalline growth i.e. epitaxy of materials and compound semiconductors 204, including Group III-nitride elements. Gaseous by products are exhausted out of the MOCVD reactor. The exhausted by products are labeled 'By Products Exhaust' 206 in FIG. 2.

The gases 202 injected into the MOCVD reactor contain the desired constituent element e.g. carbon, iron or both carbon and iron used to dope the III-nitride buffer layers 102, 104, 116. The organic compounds or metalorganics which react at the surface already contain carbon for standard GaN epi growth, which typically employs ammonia gas as part of the gas source 202. To achieve iron doping in one or more of the III-nitride buffer layers 102, 104, 116, a Fe-containing gas can be added to the MOCVD reactor. In general, with crystalline growth of Group III-nitride elements by MOCVD, all III-nitride epi layers have a background doping concentration of carbon. Low carbon levels in the III-nitride channel and barrier layers 106, 108 advantageously result in a minimum shift in Rdson (on-state resistance). The MOCVD process can be controlled to ensure acceptably low carbon levels in the III-nitride channel and barrier layers 106, 108 e.g. between $5e15/cm^3$ and $5e16/cm^3$ for a GaN channel layer and an AlGaN barrier layer. In one embodiment, the carbon level in the III-nitride channel and barrier layers 106, 108 is $<=2e16/cm^3$ for a GaN channel layer and an AlGaN barrier layer.

The upper III-nitride buffer layer 104 doped with carbon and/or iron has an average doping concentration of carbon and/or iron which is comparable to or greater than that of the III-nitride device channel layer 106. The lower III-nitride buffer layer 102 doped with carbon and/or iron has an average doping concentration of carbon and/or iron which is greater than that of the upper III-nitride buffer layer 104. Any intermediary III-nitride buffer layers 116 doped with carbon and/or iron have an average doping concentration between that of the lower and upper doped buffer layers 102, 104. The doping concentration can be varied by modifying the MOCVD process during epitaxial growth of the III-nitride buffer layers 102, 104, 116.

For example, in the case of carbon as the only constituent doping element for the III-nitride buffer layers 102, 104, 116, the temperature of the growth substrate 110 can be decreased which results in a higher carbon doping concentration in the resulting epi layers. In another embodiment, ammonia gas flow rate can be modified to change the crystalline composition of the epi layer being grown which in turn modulates the carbon in that layer. In yet another embodiment, an external dopant source can be introduced into the MOCVD reactor to increase the constituent element doping concentration in the epi layer. For example, propane can be introduced into the MOCVD reactor as an additional source of carbon for increasing the average concentration of carbon in the epi layer being grown.

In the case of carbon and iron or just iron as the constituent doping element for the III-nitride buffer layers 102, 104, 116, an external Fe-containing doping source can be introduced into the MOCVD reactor as part of the incoming gas stream 202. The flow rate of the Fe-containing source can be adjusted to obtain the desired iron doping concentration, and the metal-organics inherently provided as part of the MOCVD process can be adjusted to obtain the desired carbon doping concentration of more than background C doping concentrations are desired.

The MOCVD process modifications described above can be made alone or in any combination to adjust the concentration of carbon and/or iron in the III-nitride buffer layers 102, 104, 116.

In one embodiment, the upper III-nitride buffer layer 104 has a graded concentration of carbon and/or iron. The graded concentration has a maximum at the side of the upper III-nitride buffer layer 104 facing the lower III-nitride buffer layer 102, and a minimum at the side of the upper III-nitride buffer layer 104 facing the III-nitride device channel layer 106. According to this embodiment, the doping concentration of the constituent element(s) decreases gradually from the highest level near the lower III-nitride buffer layer 102 to the lowest level near the III-nitride device layers 106, 108. Such a doping concentration configuration provides a gradual transition in the constituent elements(s) concentration between the more highly doped lower III-nitride buffer layer 102 and the more lightly doped III-nitride device layers 106, 108, and can be realized by gradually adjusting one or more of the MOCVD process parameters described above. For example, the growth substrate temperature, ammonia gas flow rate, external dopant source flow rate, etc. can be gradually adjusted during the epitaxial growth process.

In another embodiment, the concentration of carbon and/or iron in the upper III-nitride buffer layer 104 has a stepped profile such that the concentration of carbon and/or iron has at least one step-wise decrease in a direction heading from the lower III-nitride buffer layer 102 towards the III-nitride device layers 106, 108. According to this embodiment, the doping concentration of the constituent element(s) decreases step-wise from the highest level near the lower III-nitride buffer layer 102 to the lowest level near the III-nitride device layers 106, 108. Such a doping concentration configuration provides one or more abrupt transitions in the concentration of constituent elements(s) between the more highly doped lower III-nitride buffer layer 102 and the more lightly doped III-nitride device layers 106, 108, and can be realized by altering MOCVD epi process conditions. For example, the growth substrate temperature can be changed from one value to another while the MOCVD epi process is effectively stopped or halted, and then the MOCVD process can be restarted once the growth substrate 200 reaches the new temperature. The same applies to ammonia gas flow rate, external dopant source flow rate, etc. Such a MOCVD epi process results in the upper III-nitride buffer layer 104 including two or more sub-layers, each sub-layer having a different average constituent element(s) concentration with step-wise transitions in the doping concentration between sub-layers.

Figure 3:
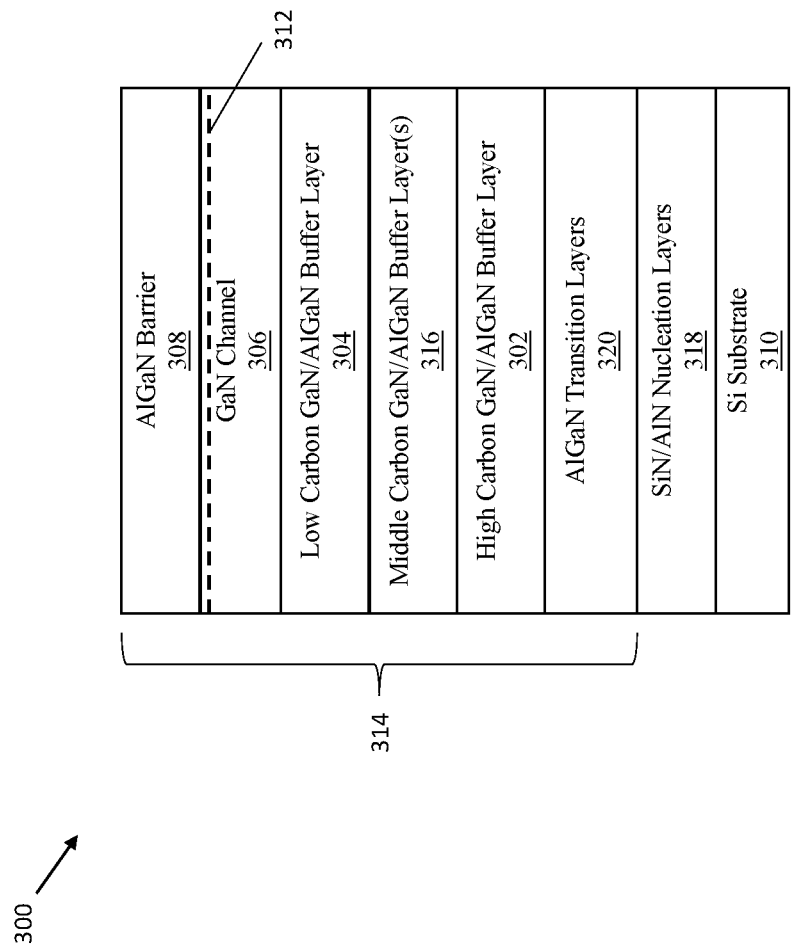
FIG. 3 illustrates a sectional view of another embodiment of a compound semiconductor device having doped epi structures.

FIG. 3 illustrates another embodiment of a compound semiconductor device 300 having fast dynamic switching and high breakdown voltage characteristics. According to this embodiment, the lower III-nitride buffer layer 302 comprises GaN or AlGaN with Al content of 1 to 20% and doped with carbon but not iron. The upper III-nitride buffer layer 304 similarly comprises GaN or AlGaN with Al content of 1 to 20% and doped with carbon but not iron.

The thickness of the lower GaN/AlGaN buffer layer 302 directly determines the vertical breakdown voltage of the epi stack 314. In one embodiment, the lower GaN/AlGaN buffer layer 302 has a thickness in a range between 0.5 micron to 3 microns e.g. between 1.5 and 2 microns. The upper GaN/AlGaN buffer layer 304 can similarly have a thickness in a range between 0.5 micron to 3 microns e.g. between 1 and 2 microns. If one or more additional III-nitride buffers layers 316 are interposed between the upper and lower GaN/AlGaN buffer layers 302, 304, each of these additional buffer layers 316 likewise comprises GaN or AlGaN doped with carbon but not iron and can have the same or similar thickness as the lower and upper GaN/AlGaN buffer layers 302, 304. The average carbon concentration of each intermediary GaN/AlGaN buffer layer 316 is between that of the lower and upper GaN/AlGaN buffer layers 302, 304. Each GaN/AlGaN buffer layer 302, 304, 316 can have a graded Al concentration for managing film stress during the epi growth and cool down process, preventing GaN epi film cracking.

The III-nitride device channel layer 306 comprises GaN and the III-nitride barrier layer 308 comprises AlGaN according to this embodiment. The thickness and Al content of the AlGaN barrier layer 308 are such that a two-dimensional charge carrier gas 312 arises along the interface between the GaN channel and AlGaN barrier layers 306, 308.

Specifically, with regard to GaN technology, the presence of polarization charges and strain effects in a GaN-based heterostructure body 314 due to spontaneous and piezoelectric polarization yield a two-dimensional charge carrier gas 312 in the heterostructure body 314 characterized by very high carrier density and carrier mobility. This two-dimensional charge carrier gas 312, such as a 2DEG (two-dimensional electron gas) or 2DHG (two-dimensional hole gas), forms the conductive channel of the device near the interface between the III-nitride barrier layer 308, e.g., a GaN alloy barrier such as AlGaN, InAlGaN, InAlN, etc. and the III-nitride channel layer 306, e.g., a GaN channel layer. A thin, e.g. 1-2 nm, AlN layer (not shown) can be provided between the GaN channel layer 306 and the GaN alloy barrier layer 308 to minimize alloy scattering and enhance 2DEG mobility.

In a broad sense, the compound semiconductor devices described herein can be formed from any binary, ternary or quaternary III-nitride compound semiconductor material where piezoelectric effects or a heterojunction is responsible for the device concept. The III-nitride semiconductor bodies 114/314 can be manufactured on a semiconductor substrate 110/310 such as a Si, SiC or sapphire substrate. In the case of a Si growth substrate 310 as shown in FIG. 3, a nucleation (seed) layer 318 such as SiN or AlN can be formed (e.g. in the case of a Si growth substrate) for providing thermal and lattice matching to the III-nitride semiconductor body 314. The III-nitride semiconductor body 314 may also include AlGaN/AlInN/AlN/GaN transition/barrier/spacer/buffer structures, including one or more transition layers 320 such as one or more AlGaN epi layers interposed between the lowermost GaN/AlGaN buffer layer 302 and the nucleation layer 318 and growth substrate 310. If the growth substrate 110/310 is not a Si substrate, but instead a SiC or sapphire substrate, such transition layers may not be needed between the lowermost III-nitride buffer layer 102/302 and the nucleation layer 318 or growth substrate 310 as indicated by the dashed line in FIG. 1. Regardless, at least one III-nitride transition layer 320 may still be present below the lowermost III-nitride buffer layer 102/302 as shown in FIG. 3. In this case, the lowermost III-nitride buffer layer 102/302 has a higher average concentration of carbon and/or iron than each III-nitride transition layer 320 beneath it.

Returning to the exemplary embodiment illustrated in FIG. 3, the lower GaN/AlGaN buffer layer 302 is doped with only carbon and not iron and has an average carbon doping concentration greater than that of the upper GaN/AlGaN buffer layer 304. The upper GaN/AlGaN buffer layer 304 also is doped with only carbon and not iron and has an average carbon doping concentration comparable to or greater than that of the GaN channel layer 306.

Figure 4:
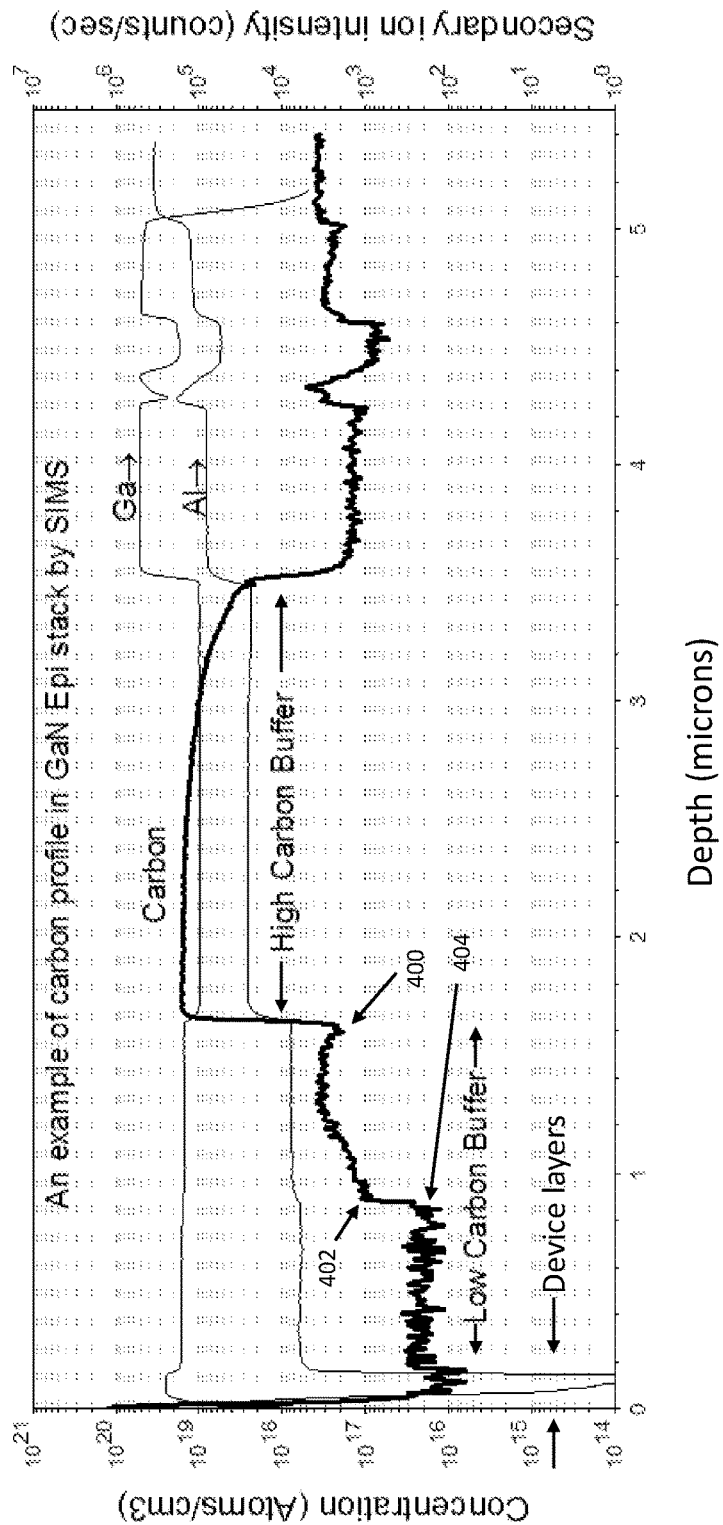
FIG. 4 illustrates a plot diagram of an embodiment of carbon doping concentration levels for different epi layers of the compound semiconductor device shown in FIG. 3.

FIG. 4 is a plot diagram which illustrates an embodiment of the Al, Ga and C doping concentrations (in atoms/cm$^3$) and ion intensities (in counts/second) of the different III-nitride layers of the compound semiconductor device 300 shown in FIG. 3. The spike in the carbon concentration near the top surface of the compound semiconductor device 100 represents an anomaly in the SIMS (Secondary Ion Mass Spectrometry) measurement technique used to collect the data plotted in FIG. 4, and ideally should not exceed 1e16/cm$^3$ so as to minimize Rdson shift. According to the embodiment illustrated in FIG. 4, the average carbon doping concentration of the lower GaN/AlGaN buffer layer 302 is in a range between 5e18/cm$^3$ and 9e19/cm$^3$ so as to yield high breakdown voltage. The average carbon doping concentration of the upper GaN/AlGaN buffer layer 304 is in a range between 5e15/cm$^3$ and 3e17/cm$^3$ so as to yield fast dynamic switching. The average carbon doping concentration of the GaN channel and AlGaN barrier layers 306, 308 is in a range between 5e15/cm$^3$ and 5e16/cm$^3$ so as to minimize Rdson shift.

FIG. 4 shows the concentration of carbon in the upper GaN/AlGaN buffer layer 304 (labeled 'Low Carbon Buffer' in FIG. 4) having a stepped profile, such that the carbon concentration has at least one step-wise decrease in a direction heading from the lower GaN/AlGaN buffer layer 302 (labeled 'High Carbon Buffer' in FIG. 4) towards the GaN channel and AlGaN barrier layers 306, 308 (labeled 'Device Layers' in FIG. 4). The stepped profile can be realized as previously described herein. In one embodiment, the concentration of carbon in the upper GaN/AlGaN buffer layer 304 starts from about 3e17/cm$^3$ at a first step 400, ramps down to about 1e17/cm$^3$ at a second step 402, and then further reduces to about 2e16/cm$^3$ at a third step 404 heading in a direction from the lower GaN/AlGaN buffer layer 302 towards the GaN channel layer 306. Such a stepped carbon concentration profile achieves both high breakdown voltage and low Rdson shift in GaN HEMT device operation.

Alternatively, the upper GaN/AlGaN buffer layer 304 can have a graded concentration of carbon with a maximum carbon concentration at the side of the upper GaN/AlGaN buffer layer 304 facing the lower GaN/AlGaN buffer layer 302 and a minimum carbon concentration at the side of the upper GaN/AlGaN buffer layer 304 facing the GaN channel and AlGaN barrier device layers 306, 308 also as previously described herein. In the case of a graded concentration of carbon in the upper GaN/AlGaN buffer layer 304, the maximum carbon concentration of the upper GaN/AlGaN buffer layer 304 does not exceed 3e17/cm$^3$ and the minimum carbon concentration of the upper GaN/AlGaN buffer layer 304 is not below 5e15/cm$^3$ in one embodiment. In the case of no grading of the carbon concentration in the upper GaN/AlGaN buffer layer 304, the average concentration of carbon in the GaN channel and AlGaN barrier device layers 306, 308 is $\le$2e16/cm$^3$ in one embodiment. Low carbon concentration in the GaN channel and AlGaN barrier device layers 306, 308 ensures good device performance as previously explained herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A compound semiconductor device, comprising:
    a first III-nitride buffer layer doped with carbon and/or iron;
    a second III-nitride buffer layer above the first III-nitride buffer layer and doped with carbon and/or iron;
    a first III-nitride device layer above the second III-nitride buffer layer; and
    a second III-nitride device layer above the first III-nitride device layer and having a different band gap than the first III-nitride device layer,
    wherein a two-dimensional charge carrier gas arises along an interface between the first and second III-nitride device layers,
    wherein the first III-nitride buffer layer has an average doping concentration of carbon and/or iron which is greater than that of the second III-nitride buffer layer,
    wherein the second III-nitride buffer layer has an average doping concentration of carbon and/or iron which is comparable to or greater than that of the first III-nitride device layer.

2. The compound semiconductor device of claim 1, wherein:
    the first III-nitride buffer layer is doped with carbon but not iron;
    the second III-nitride buffer layer is doped with carbon but not iron;
    the first III-nitride buffer layer has an average carbon doping concentration greater than that of the second III-nitride buffer layer; and the second III-nitride buffer layer has an average carbon doping concentration comparable to or greater than that of the first III-nitride device layer.

3. The compound semiconductor device of claim 1, wherein:
the first III-nitride buffer layer comprises GaN or AlGaN doped with carbon but not iron;
the second III-nitride buffer layer comprises GaN or AlGaN doped with carbon but not iron;
the first III-nitride device layer comprises GaN;
the second III-nitride device layer comprises AlGaN;
the first III-nitride buffer layer has an average carbon doping concentration greater than that of the second III-nitride buffer layer; and
the second III-nitride buffer layer has an average carbon doping concentration comparable to or greater than that of the first III-nitride device layer.

4. The compound semiconductor device of claim 3, wherein the average carbon doping concentration of the first III-nitride buffer layer is in a range between $5e18/cm^3$ and $9e19/cm^3$.

5. The compound semiconductor device of claim 3, wherein the average carbon doping concentration of the second III-nitride buffer layer is in a range between $5e15/cm^3$ and $3e17/cm^3$.

6. The compound semiconductor device of claim 3, wherein the average carbon doping concentration of the first III-nitride device layer is in a range between $5e15/cm^3$ and $5e16/cm^3$.

7. The compound semiconductor device of claim 3, wherein the second III-nitride buffer layer has a graded concentration of carbon with a maximum carbon concentration at a side of the second III-nitride buffer layer facing the first III-nitride buffer layer and a minimum carbon concentration at a side of the second III-nitride buffer layer facing the first III-nitride device layer.

8. The compound semiconductor device of claim 7, wherein the maximum carbon concentration of the second III-nitride buffer layer does not exceed $3e17/cm^3$ and the minimum carbon concentration of the second III-nitride buffer layer is not below $5e15/cm^3$.

9. The compound semiconductor device of claim 3, wherein the concentration of carbon in the second III-nitride buffer layer has a stepped profile such that the carbon concentration has at least one step-wise decrease in a direction heading from the first III-nitride buffer layer towards the first III-nitride device layer.

10. The compound semiconductor device of claim 3, wherein the first III-nitride buffer layer has a thickness in a range between 0.5 micron to 3 microns.

11. The compound semiconductor device of claim 3, wherein the second III-nitride buffer layer has a thickness in a range between 0.5 micron to 3 microns.

12. The compound semiconductor device of claim 1, wherein the second III-nitride buffer layer has a graded concentration of carbon and/or iron with a maximum at a side of the second III-nitride buffer layer facing the first III-nitride buffer layer and a minimum at a side of the second III-nitride buffer layer facing the first III-nitride device layer.

13. The compound semiconductor device of claim 1, wherein the concentration of carbon and/or iron in the second III-nitride buffer layer has a stepped profile such that the concentration of carbon and/or iron has at least one step-wise decrease in a direction heading from the first III-nitride buffer layer towards the first III-nitride device layer.

14. The compound semiconductor device of claim 1, further comprising:
a substrate; and
one or more III-nitride transition layers between the substrate and the first III-nitride buffer layer,
wherein the average doping concentration of carbon and/or iron of the first III-nitride buffer layer is greater than that of the one or more III-nitride transition layers.

15. The compound semiconductor device of claim 14, wherein:
the substrate is a Si substrate;
the first III-nitride buffer layer comprises GaN or AlGaN doped with carbon but not iron; and
the first III-nitride buffer layer has an average carbon doping concentration greater than that of the one or more III-nitride transition layers.

16. The compound semiconductor device of claim 1, wherein the concentration of carbon and/or iron in the first III-nitride buffer layer yields a breakdown voltage greater than 700V and the concentration of carbon and/or iron in the second III-nitride buffer layer yields a shift in Rdson from an off-state to an on-state of less than 20%.

17. The compound semiconductor device of claim 1, further comprising at least one additional III-nitride buffer layer interposed between the first and second III-nitride buffer layers and doped with carbon and/or iron, wherein the at least one additional III-nitride buffer layer has an average doping concentration of carbon and/or iron which is between that of the first and second III-nitride buffer layers.

18. A method of manufacturing a compound semiconductor device, the method comprising:
forming a first III-nitride buffer layer having a first average doping concentration of carbon and/or iron;
forming a second III-nitride buffer layer above the first III-nitride buffer layer, the second III-nitride buffer layer having a second average doping concentration of carbon and/or iron which is less than the first average doping concentration;
forming a first III-nitride device layer above the second III-nitride buffer layer, the first III-nitride device layer having a third average doping concentration of carbon and/or iron which is comparable to or less than the second average doping concentration; and
forming a second III-nitride device layer above the first III-nitride device layer, the second III-nitride device layer having a different band gap than the first III-nitride device layer, wherein a two-dimensional charge carrier gas arises along an interface between the first and second III-nitride device layers.

19. The method of claim 18, further comprising:
doping the first III-nitride buffer layer with carbon but not iron;
doping the second III-nitride buffer layer with carbon but not iron; and
doping the first III-nitride device layer with carbon but not iron,
wherein the first average doping concentration of carbon is greater than the second average doping concentration of carbon,
wherein the second average doping concentration of carbon is comparable to or greater than the third average doping concentration of carbon.

20. The method of claim 18, further comprising:
doping the second III-nitride buffer layer so as to have a graded concentration of carbon and/or iron with a maximum at a side of the second III-nitride buffer layer facing the first III-nitride buffer layer and a minimum at a side of the second III-nitride buffer layer facing the first III-nitride device layer.

* * * * *